US010691180B2

(12) United States Patent
Choi et al.

(10) Patent No.: US 10,691,180 B2
(45) Date of Patent: Jun. 23, 2020

(54) WEARABLE ELECTRONIC DEVICES HAVING A MULTI-USE SINGLE SWITCH AND METHODS OF USE THEREOF

(71) Applicant: NORTH INC., Vancouver (CA)

(72) Inventors: Jaehong Choi, Kitchener (CA); Marie Stipancik, Waterloo (CA); Jennifer Anne Pretti, Waterloo (CA); Jason T. Griffin, Kitchener (CA)

(73) Assignee: North Inc., Kitchener, ON (CA)

( * ) Notice: Subject to any disclaimer, the term of this patent is extended or adjusted under 35 U.S.C. 154(b) by 0 days.

(21) Appl. No.: 16/226,213

(22) Filed: Dec. 19, 2018

(65) Prior Publication Data

US 2019/0187749 A1 Jun. 20, 2019

Related U.S. Application Data

(60) Provisional application No. 62/607,816, filed on Dec. 19, 2017.

(51) Int. Cl.
| | |
|---|---|
| *G06F 1/16* | (2006.01) |
| *G06F 3/0338* | (2013.01) |
| *H03K 17/965* | (2006.01) |
| *H04W 4/20* | (2018.01) |
| *G06F 3/0346* | (2013.01) |
| *G06F 3/01* | (2006.01) |
| *G05G 9/047* | (2006.01) |

(52) U.S. Cl.
CPC .............. *G06F 1/169* (2013.01); *G06F 3/014* (2013.01); *G06F 3/0338* (2013.01); *G06F 3/0346* (2013.01); *H03K 17/965* (2013.01); *H04W 4/20* (2013.01); *G05G 9/047* (2013.01); *G05G 9/04796* (2013.01); *G05G 2009/04777* (2013.01); *G06F 1/163* (2013.01)

(58) Field of Classification Search
None
See application file for complete search history.

(56) References Cited

U.S. PATENT DOCUMENTS

| | | | | |
|---|---|---|---|---|
| 5,481,265 A | * | 1/1996 | Russell | ...................... A61F 4/00 101/486 |
| 5,489,922 A | * | 2/1996 | Zloof | ..................... G06F 3/0362 345/156 |
| 5,832,296 A | * | 11/1998 | Wang | ..................... G06F 3/0338 340/539.22 |

(Continued)

*Primary Examiner* — Xanthia C Cunningham
(74) *Attorney, Agent, or Firm* — Thomas Mahon (57) ABSTRACT

A wearable electronic device includes a body defining an aperture therethrough, sized and shaped to receive a digit of a user. The wearable electronic device may include a processor housed in the body and an input device at least partially extending from an outer surface of the body to receive input from another digit of the user. The input device has an actuating surface that is movable between a first position and a second position. Movement of the actuating surface between the first position and second position provides an input to the processor. The wearable electronic device includes a transmitter coupled to the processor and configured to send electronic transmissions to an external electronic device, the electronic transmissions corresponding to the inputs received from the user, and a power source for providing power to the processor, the input device, and the transmitter.

11 Claims, 9 Drawing Sheets

(56) References Cited

U.S. PATENT DOCUMENTS

| | | | | |
|---|---|---|---|---|
| 6,297,808 B1* | 10/2001 | Yang | G06F 3/03549 | 345/167 |
| 6,778,380 B2* | 8/2004 | Murray, Jr. | H01H 9/0235 | 340/12.55 |
| D508,965 S * | 8/2005 | Golliher | D21/566 | |
| 7,435,889 B1* | 10/2008 | Heidt | G10D 13/003 | 84/320 |
| 7,569,762 B2* | 8/2009 | Baum, Jr. | G10H 1/0083 | 84/615 |
| 8,570,273 B1* | 10/2013 | Smith | G06F 3/0338 | 345/156 |
| D740,827 S * | 10/2015 | Sun | D14/427 | |
| D753,114 S * | 4/2016 | Osterhout | D14/402 | |
| 9,335,790 B2* | 5/2016 | Stotler | G06F 1/163 | |
| 9,733,700 B2* | 8/2017 | Song | G06F 3/0338 | |
| 10,037,052 B2* | 7/2018 | Stotler | G06F 1/163 | |
| 10,061,458 B1* | 8/2018 | Bristol | G06F 3/03547 | |
| 10,139,966 B2* | 11/2018 | Pelis | G06F 3/044 | |
| 10,183,217 B2* | 1/2019 | Chen | A63F 13/214 | |
| 10,347,144 B2* | 7/2019 | Subiakto | G06F 1/1626 | |
| 2003/0038783 A1* | 2/2003 | Baughman | G06F 3/03543 | 345/163 |
| 2003/0142065 A1* | 7/2003 | Pahlavan | G06F 3/0346 | 345/156 |
| 2004/0174337 A1* | 9/2004 | Kubota | G06F 3/014 | 345/156 |
| 2006/0164383 A1* | 7/2006 | Machin | G05G 9/047 | 345/156 |
| 2007/0176894 A1* | 8/2007 | Abe | H04N 5/4403 | 345/156 |
| 2009/0153477 A1* | 6/2009 | Saenz | G06F 3/014 | 345/158 |
| 2010/0156783 A1* | 6/2010 | Bajramovic | G06F 1/163 | 345/156 |
| 2010/0188336 A1* | 7/2010 | Ng | G06F 1/1616 | 345/163 |
| 2010/0328205 A1* | 12/2010 | Cheng | G06F 3/014 | 345/157 |
| 2011/0037695 A1* | 2/2011 | Bor | G06F 3/033 | 345/158 |
| 2012/0075173 A1* | 3/2012 | Ashbrook | G06F 3/014 | 345/156 |
| 2015/0065090 A1* | 3/2015 | Yeh | H04W 12/06 | 455/411 |
| 2015/0277559 A1* | 10/2015 | Vescovi | G06F 3/014 | 345/173 |
| 2016/0034742 A1* | 2/2016 | Kim | H04B 1/385 | 382/124 |
| 2016/0077582 A1* | 3/2016 | Song | G06F 3/0338 | 345/173 |
| 2016/0306422 A1* | 10/2016 | Parham | G06F 3/014 | |
| 2016/0363996 A1* | 12/2016 | Higgins | G06F 3/014 | |
| 2016/0364910 A1* | 12/2016 | Higgins | G02B 27/017 | |
| 2017/0147033 A1* | 5/2017 | Pastorino | G06F 3/0362 | |
| 2019/0067968 A1* | 2/2019 | Guo | H02J 7/0045 | |

* cited by examiner

WEARABLE ELECTRONIC DEVICES HAVING A MULTI-USE SINGLE SWITCH AND METHODS OF USE THEREOF

BACKGROUND

Technical Field

The present systems, devices, and methods generally relate to wearable electronic devices and particularly relate to wearable electronic devices having multi-use single switches.

Description of the Related Art

Wearable Electronic Devices

Electronic devices are commonplace throughout most of the world today. Advancements in integrated circuit technology have enabled the development of electronic devices that are sufficiently small and lightweight to be carried by the user. Such "portable" electronic devices may include on-board power supplies (such as batteries or other power storage systems) and may be "wireless" (i.e., designed to operate without any wire-connections to other, non-portable electronic systems); however, a small and lightweight electronic device may still be considered portable even if it includes a wire-connection to a non-portable electronic system. For example, a microphone may be considered a portable electronic device whether it is operated wirelessly or through a wire-connection.

The convenience afforded by the portability of electronic devices has fostered a huge industry. Smartphones, audio players, laptop computers, tablet computers, and ebook readers are all examples of portable electronic devices. However, the convenience of being able to carry a portable electronic device has also introduced the inconvenience of having one's hand(s) encumbered by the device itself. This problem is addressed by making an electronic device not only portable, but wearable.

A wearable electronic device is any portable electronic device that a user can carry without physically grasping, clutching, or otherwise holding onto the device with their hands. For example, a wearable electronic device may be attached or coupled to the user by a strap or straps, a band or bands, a clip or clips, an adhesive, a pin and clasp, an article of clothing, tension or elastic support, an interference fit, an ergonomic form, etc. Examples of wearable electronic devices include digital wristwatches, electronic armbands, electronic rings, electronic ankle-bracelets or "anklets," head-mounted electronic display units, hearing aids, and so on.

Because they are worn on the body of the user, visible to others, and generally present for long periods of time, form factor (i.e., size, geometry, and appearance) is a major design consideration in wearable electronic devices.

BRIEF SUMMARY

According to a broad aspect, a wearable electronic device is provided herein. The wearable electronic device includes a body defining an aperture there through. The aperture is sized and shaped to receive a digit of a user. The wearable electronic device also includes a computer processor housed in the body and an input device at least partially extending from an outer surface of the body to receive input from another digit of the user. The input device has an actuating surface that is movable between a first position and a second position. Movement of the actuating surface between the first position and second position provides an input to the processor. The wearable electronic device also includes a transmitter coupled to the computer processor and configured to send electronic transmissions to an external electronic device, the electronic transmissions corresponding to the inputs received from the user, and a power source for providing power to the computer processor, the input device and the transmitter.

According to other aspects, the input device is a joystick and movement of the actuating surface between the first position and the second position includes at least side-to-side movement of the joystick, up and down movement of the joystick and depression of the joystick in a direction towards the aperture of the body.

According to other aspects, the joystick partially extends from a first end of the wearable electronic device proximate to a top portion.

According to other aspects, the input device is configured as a ring that surrounds the body, the ring providing at least two segments, each segment movable between a first position and a second position to provide input to the processor.

According to other aspects, the ring is discontinuous at a first end of the body to provide the at least two segments.

According to other aspects, the each of the first and second segments is a tactile switch.

According to other aspects, the body has an inner surface and an outer surface and at least a portion of the inner surface is a vertical segment configured to inhibit rotation of the wearable electronic device about the user's digit when the actuating surface is actuated.

According to other aspects, the vertical segment is adjacent to the input device.

According to other aspects, the body has an annular shape.

According to other aspects, the power source is a rechargeable charging member.

According to a broad aspect, a method of controlling an external electronic device with a wearable electronic device is provided herein. The method includes receiving via an input device of the wearable electronic device coupled to a processor of the wearable electronic device a first input, the first input corresponding to a movement of the input device between a first position and a second position; and transmitting by a transmitter of the wearable electronic device a signal based on the first input to the external electronic device, the signal corresponding to a command to be executed by the external electronic device.

According to other aspects, the input is associated to the command by the processor of the wearable electronic device and the command is transmitted as the signal to the external electronic device.

According to other aspects, the input is associated to the command by a processor of the external electronic device.

According to a broad aspect, a system is provided herein. The system includes a wearable electronic device. The wearable electronic device includes a body defining an aperture there through. The aperture is sized and shaped to receive a digit of a user. The wearable electronic device also includes a computer processor housed in the body and an input device at least partially extending from an outer surface of the body to receive input from another digit of the user. The input device has an actuating surface that is movable between a first position and a second position. Movement of the actuating surface between the first position and second position provides an input to the processor. The wearable electronic device also includes a transmitter coupled to the computer processor that is configured to send electronic transmissions, the electronic transmissions corresponding to the inputs received from the user, and a power source for providing power to the computer processor, the input device and the transmitter. The system also includes an external electronic device communicatively coupled to the wearable electronic device and configured to receive the electronic transmissions corresponding to the inputs of the wearable electronic device.

According to other aspects, the input device is a joystick and movement of the actuating surface between the first position and the second position includes at least side-to-side movement of the joystick, up and down movement of the joystick and depression of the joystick in a direction towards the aperture of the body.

According to other aspects, the joystick partially extends from a first end of the wearable electronic device proximate to a top portion.

According to other aspects, the input device is configured as a split ring that surrounds the body, the split ring providing at least two segments, each segment movable between a first position and a second position to provide input to the processor.

According to other aspects, the split ring is discontinuous at a first end of the body to provide the at least two segments.

According to other aspects, the body has an inner surface and an outer surface and at least a portion of the inner surface is a vertical segment configured to inhibit rotation of the wearable electronic device about the user's digit when the actuating surface is actuated.

According to other aspects, the vertical segment is adjacent to the input device.

A wearable electronic device may be summarized as including: a body defining an aperture therethrough, the aperture sized and shaped to receive a first digit of a user; a processor housed in the body; an input device at least partially extending from an outer surface of the body and communicatively coupled to the processor, the input device operable to receive a multitude of different inputs from a second digit of the user, each input characterized by a respective combination of input parameters; and a transmitter communicatively coupled to the processor, the transmitter to send wireless transmissions to an external electronic device, each wireless transmission corresponding to a respective input received by the input device. The input device may include a joystick and inputs received from the second digit of the user may include: side-to-side movement of the joystick, up and down movement of the joystick, and depression of the joystick in a direction towards the aperture of the body. The joystick may partially extend from a first end of the wearable electronic device proximate to a top portion of the wearable electronic device.

The input device may include a ring that surrounds the body, the ring providing at least two segments, each segment movable by the second digit of the user between a first position and a second position to provide input to the processor. The ring may be discontinuous at a first end of the body to provide the at least two segments. Each of the at least two segments may be a tactile switch.

The body may have an inner surface and an outer surface and at least a portion of the inner surface may be a vertical segment to inhibit rotation of the wearable electronic device about the first digit. The vertical segment may be adjacent to the input device.

The body may have an annular shape. The wearable electronic device may further include a power source communicatively coupled to at least the processor and the transmitter.

Each respective combination of input parameters may comprise at least one input parameter selected from a group consisting of: an input nature, an input direction, an input duration, and an input actuation pressure. Each respective combination of input parameters may comprise at least two input parameters selected from a group consisting of: an input nature, an input direction, an input duration, and an input actuation pressure. Each respective combination of input parameters may comprise at least three input parameters selected from a group consisting of: an input nature, an input direction, an input duration, and an input actuation pressure. Each respective combination of input parameters may comprise an input nature, an input direction, an input duration, and an input actuation pressure.

The wearable electronic device may further include a non-transitory processor-readable storage medium communicatively coupled to the processor, wherein the non-transitory processor-readable storage medium stores data and/or processor-executable instructions that, when executed by the processor, cause the processor to map each respective input received by the input device to a respective command based at least in part on the combination of input parameters that characterize the input, and cause the transmitter to transmit the command.

A method of controlling an external electronic device with a wearable electronic device may be summarized as including: receiving, by an input device of the wearable electronic device communicatively coupled to a processor of the wearable electronic device, a first input, the first input characterized by a first combination of input parameters; and transmitting by a transmitter of the wearable electronic device a first signal based on the first input, the first signal corresponding to a first command to be executed by the external electronic device. The first input may be associated to the first command by the processor of the wearable electronic device and the first command may be included in the first signal transmitted by the transmitter to the external electronic device. The first input may be associated to the first command by a processor of the external electronic device.

The first combination of input parameters may include at least one input parameter selected from a group consisting of: an input nature, an input direction, an input duration, and an input actuation pressure. The first combination of input parameters may include at least two input parameters selected from a group consisting of: an input nature, an input direction, an input duration, and an input actuation pressure. The first combination of input parameters may include at least three input parameters selected from a group consisting of: an input nature, an input direction, an input duration, and an input actuation pressure. The first combination of input parameters may include an input nature, an input direction, an input duration, and an input actuation pressure.

The method may further include: receiving, by the input device, a second input, the second input characterized by a second combination of input parameters, wherein the second combination of input parameters is different from the first combination of input parameters; and transmitting, by the transmitter, a second signal based on the second input, the first signal corresponding to a second command to be executed by the external electronic device, wherein the second command is different from the first command.

The input device may comprise a joystick, and receiving, by the input device a first input may include receiving, by the joystick, at least one movement selected by a group consisting of: a side-to-side movement of the joystick, an up and down movement of the joystick, and a depression of the joystick.

Receiving, by the input device of the wearable electronic device, the first input may include receiving, by the input device of the wearable electronic device worn on a first digit of a user, the first input corresponding to an actuation of the input device by a second digit of the user.

A system may be summarized as including: a wearable electronic device comprising: a body defining an aperture therethrough, the aperture sized and shaped to receive a first digit of a user; a processor housed in the body; an input device at least partially extending from an outer surface of the body and communicatively coupled to the processor, the input device operable to receive a multitude of different inputs from a second digit of the user, each input characterized by a respective combination of input parameters; and a transmitter communicatively coupled to the processor, the transmitter to send wireless transmissions, each wireless transmission corresponding to a respective input received by the input device; and an external electronic device communicatively coupled to the wearable electronic device to receive the wireless transmissions corresponding to the inputs received from the input device.

The input device may be a joystick and inputs received from the second digit of the user may include: side-to-side movement of the joystick, up and down movement of the joystick, and depression of the joystick in a direction towards the aperture of the body. The joystick may partially extend from a first end of the wearable electronic device proximate to a top portion of the wearable device.

The input device may include a split ring that surrounds the body, the split ring providing at least two segments, each segment movable by the second digit of the user between a first position and a second position to provide input to the processor. The split ring may be discontinuous at a first end of the body to provide the at least two segments.

The body may have an inner surface and an outer surface and at least a portion of the inner surface may be a vertical segment to inhibit rotation of the wearable electronic device about the first digit. The vertical segment may be adjacent to the input device.

The wearable electronic device may further include a power source communicatively coupled to at least the processor and the transmitter.

Each respective combination of input parameters may comprise at least one input parameter selected from a group consisting of: an input nature, an input direction, an input duration, and an input actuation pressure. Each respective combination of input parameters may comprise at least two input parameters selected from a group consisting of: an input nature, an input direction, an input duration, and an input actuation pressure. Each respective combination of input parameters may comprise at least three input parameters selected from a group consisting of: an input nature, an input direction, an input duration, and an input actuation pressure. Each respective combination of input parameters may comprise an input nature, an input direction, an input duration, and an input actuation pressure.

The wearable electronic device may further comprise a non-transitory processor-readable storage medium communicatively coupled to the processor, the non-transitory processor-readable storage medium storing data and/or processor-executable instructions that, when executed by the processor, cause the processor to map each respective input received by the input device to a respective command based at least in part on the combination of input parameters that characterize the input, and cause the transmitter to transmit the command.

The external electronic device may comprise smart glasses.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

Figure 1:
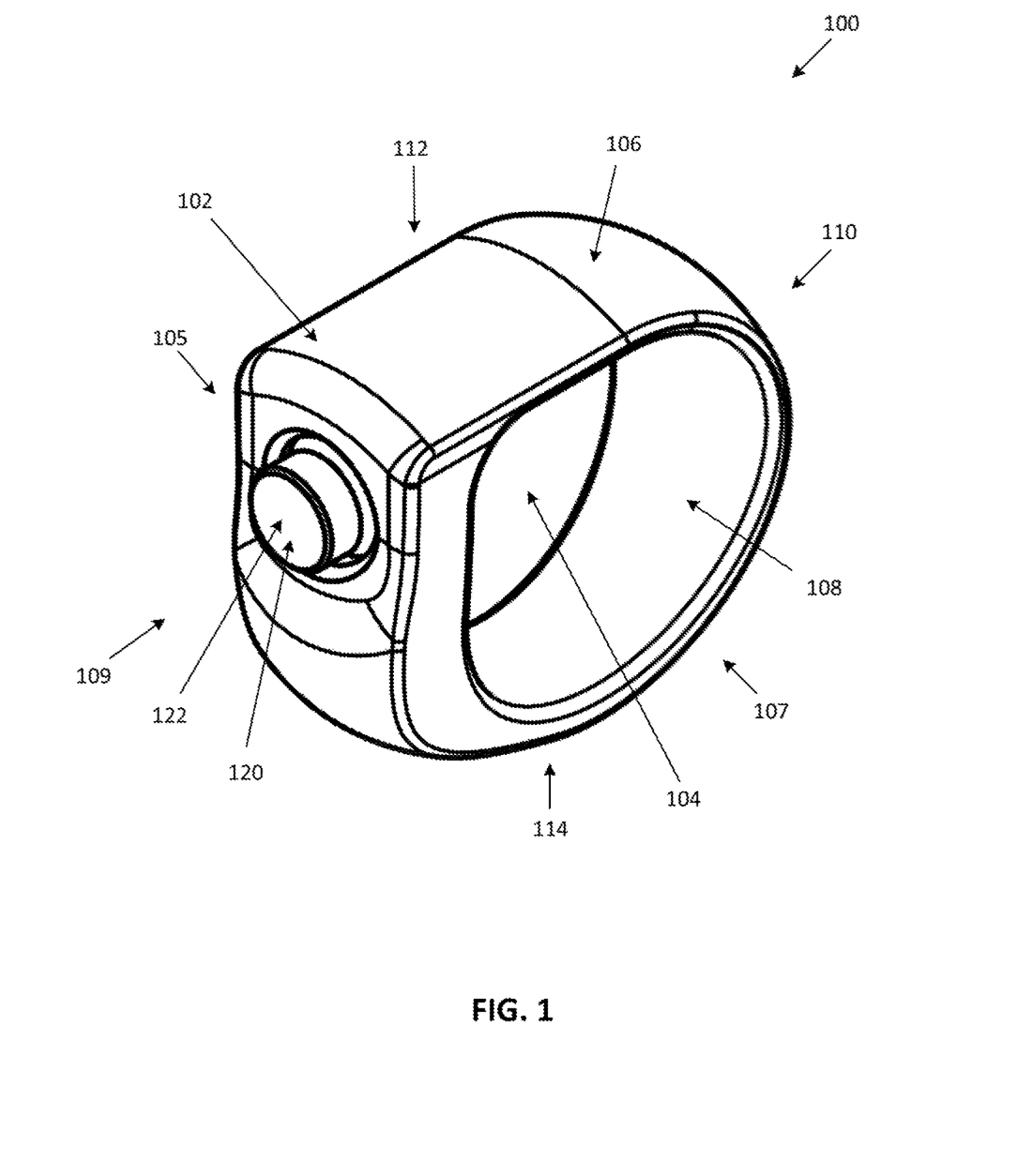
FIG. 1 is a front perspective view of a wearable electronic device having a multi-use single switch in accordance with the present systems, devices, and methods.

Referring to FIG. 1, illustrated therein is a wearable electronic device 100 in accordance with the present systems, devices, and methods. Wearable electronic device 100 has a body 102 housing one or more electronic components (such as but not limited to a processor, memory, sensors, a charging member, etc. as described below). Body 102 defines an aperture 104 sized and dimensioned to, in use, receive a user's digit (e.g., finger or thumb) so that wearable electronic device 100 may be worn on the user's digit.

Body 102 has a first side 105, a second side 107 opposed to the first side 105, a first end 109 and a second end 110 opposed to the first end 109, and a top portion 112 and a bottom portion 114 opposed to the top portion 112. Body 102 generally has an annular shape and includes an outer surface 106 and an inner surface 108. The outer surface 106 includes one or more user input devices 120, such as but not limited to one or more multi-use single switches. The inner surface 108 is sized and/or shaped to conform to the digit of the user. The inner surface 108 thereby rests against the user's digit when the device 100 is worn by the user. Wearable electronic device 100 may be available in a variety of sizes for accommodating various digit sizes and/or various types of digits.

In some implementations, the body 102 is made from a rigid or semi-rigid material such as a metal or a plastic. For instance, the body 102 may be made of gold, silver, platinum, steel, or any other appropriate metal.

Wearable electronic device 100 includes one or more input devices 120 for the electronic device 100 to receive inputs from a user. The input device 120 can assume a wide variety of forms appropriate for actuation by a user's digit (e.g., by a digit other than the digit upon which the wearable electronic device is worn, such as by a thumb if the wearable electronic device is worn on a finger of the same hand).

The input device 120 can be mechanical, electro-mechanical, and/or sensor (e.g., a membrane sensor)-based, and in more general terms provides an actuation surface 122 for receiving a user-applied actuation force or action. The input device 120 may be integrally formed with body 102, mounted to body 102 or otherwise extend from body 102 such that the actuation surface 122 faces, or is exposed or accessible at, the outer surface 106 of the body 102. The actuation surface 122 may also be optionally recessed relative to the outer surface 106 of the body 102 to inhibit incidental contact and unintentional activation of the input device 120.

A user can actuate the input device 120 by engaging and/or applying a force to the actuation surface 122. The input device 120 may be configured to be positively actuated only upon the contact of a certain percentage of the actuation surface 122 or certain minimum pressure on a pressure sensor-type switch to avoid unintended activation.

Figure 2:
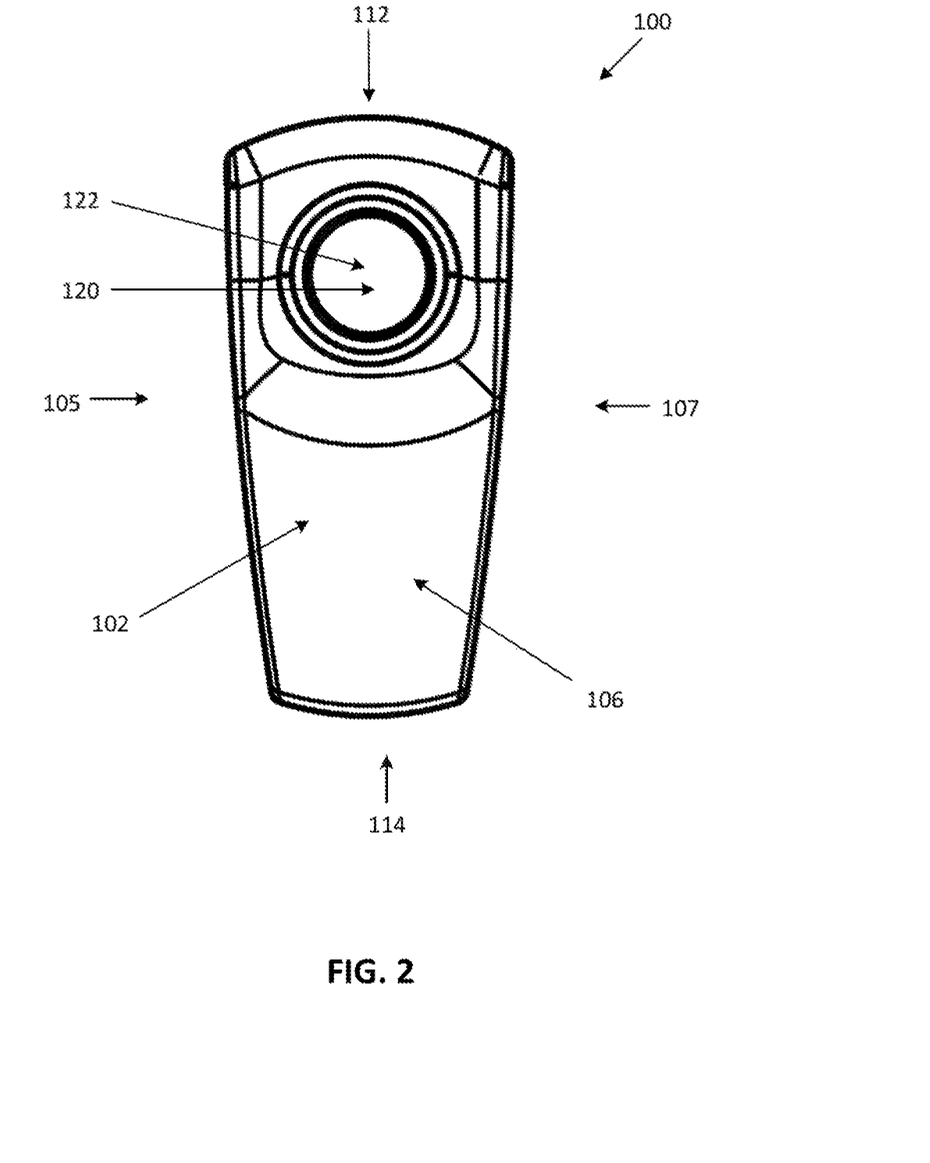
FIG. 2 is a front view of the wearable electronic device of FIG. 1.
Figure 3:
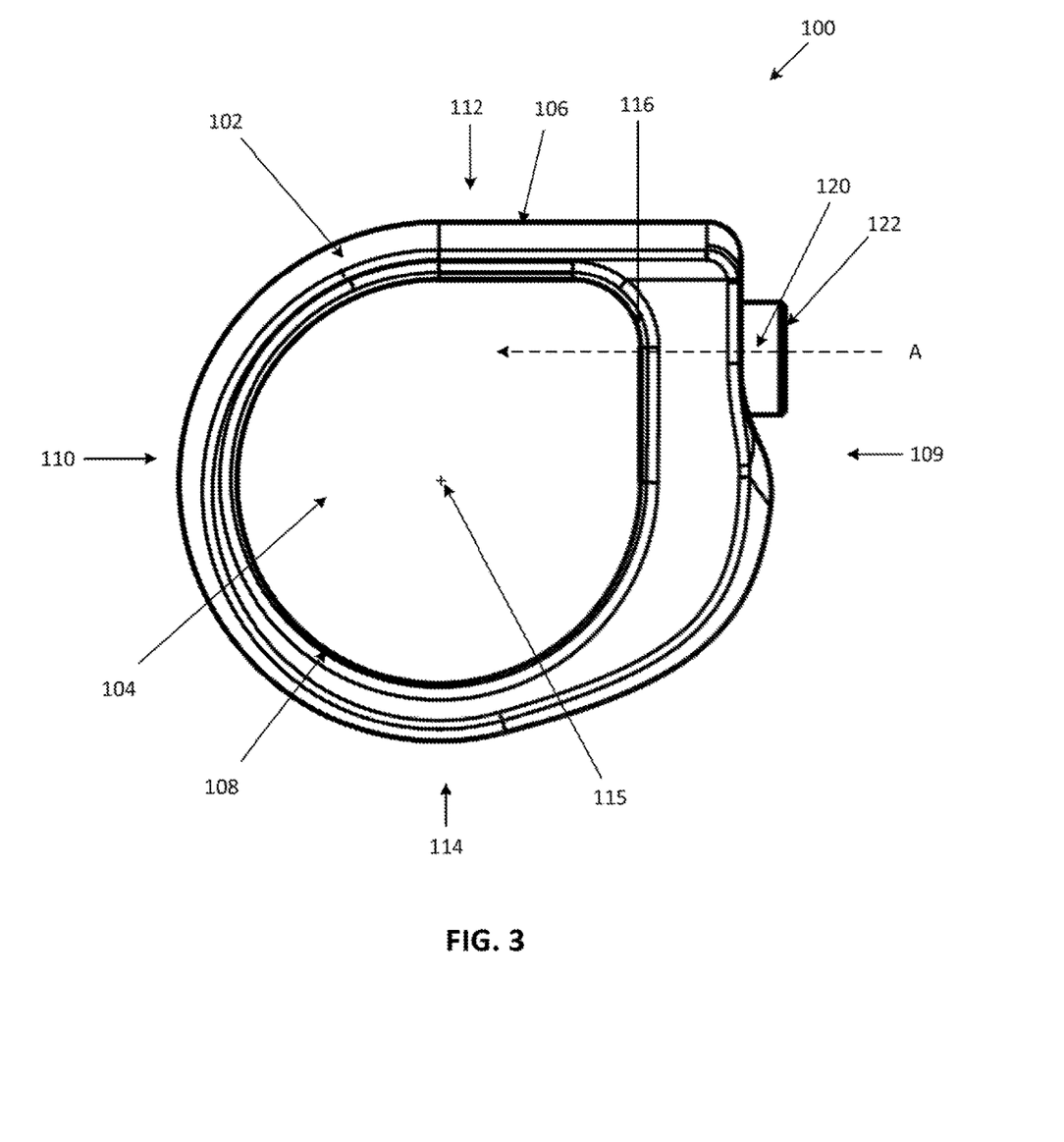
FIG. 3 is a side view of the wearable electronic device of FIG. 1.

Referring to FIGS. 1 to 3, illustrated therein is an implementation of wearable electronic device 100 where multi-use single switch input device 120 is shown as a joystick having at least five different tactile mechanisms for a user to provide input to the wearable electronic device 100. For instance, the joystick 120 can be manipulated by a user in an upward direction (i.e., in a direction towards top portion 112), a downward direction (i.e., in a direction towards bottom portion 114), a left direction (i.e., in a direction towards first side 105), a right direction (i.e., in a direction towards second side 107), and by depressing the actuation surface 122 inwardly towards the aperture 104. In another implementation, the joystick can be manipulated to be depressed 122 inwardly towards the aperture 104 in a direction that is spaced from a radial direction towards a center point 115 of the aperture 104

In some implementations, as shown in FIG. 3, inner surface 108 of wearable electronic device 100 includes a vertical segment 116 extending generally perpendicular to an axis A defined by the input device 120 and the actuating surface 122. When a user is wearing the wearable electronic device 100 on a first digit (e.g., the index finger of the right hand) and actuates actuating surface 122 with a second digit (e.g., with the thumb of the right hand) in a direction along axis A (e.g., in a direction that is spaced from a center point 115 of the wearable electronic device 100), the wearable electronic device 110 can have a tendency to rotate around the user's digit. Vertical segment 116 may inhibit rotation of the wearable electronic device 100 around the user's digit as the user wears wearable electronic device 100 and actuates actuating surface 122 in a direction perpendicular to vertical segment 116.

In the implementation shown on FIGS. 1 to 3, input device 120 is shown as at least partially extending from first end 109 of the wearable electronic device 100 proximate to top portion 112. The input device 120 may be positioned at any position along the outer surface 106 to be actuated by a digit of the user of the wearable electronic device 100 other than the digit upon which the device is worn.

The input device 120 may be any shape or size while still providing ample control for a user with a digit other than the digit upon which the device is worn. According to some embodiments, the input device 120 can be sized and shaped to have the smallest size achievable while still providing ample control for a user with a digit other than the digit upon which the device is worn.

An input can be provided to the wearable electronic device 100 by the user engaging input device 120. For instance, a user can engage the input device 120 when a digit of the user makes physical contact with input device 120 and actuates the input device 120. The physical actuation (e.g., manipulation) of the actuating surface 122 of the input device 120 is received and recognized by a processor (described below) of the device. In some implementations, the pressure of the engagement and/or the nature of the manipulation of the actuation surface 122 is translated by the processor into a computer-readable form. The processor then compares the engagement and or manipulation of the actuation surface by the user to a plurality of stored engagements/manipulations based on the input. The input may be, for example, a tap, or a double-tap, or an elongated depression (i.e., a tap and hold), or a combination of engagements or manipulations (such as a tap followed by a directional input if the input device 120 is a joystick). In this way, a single input device 120 or "switch" may be used (e.g. programmatically) to control an external electronic device in a multitude of ways, thus making the switch a "multi-use" switch.

In some implementations, a user can use various contact patterns (e.g., different timings and/or intensities of detected contacts) to provide different inputs using the input device 120 of the wearable electronic device 100, each of which may be mapped to a different function of the wearable electronic device and/or of the external electronic device to which the wearable electronic device is communicatively coupled. Therefore, an input may be detected by the wearable electronic device 100 by the wearable electronic device 100 detecting a particular contact pattern. For example, an input may be provided by a user to the wearable electronic device 100 using a soft tap gesture (e.g., slightly depressing actuation surface 122 using a weak force event). As another example, an input may be provided by a user to the wearable electronic device 100 using a hard tap gesture (e.g., greatly depressing actuation surface 122 using a strong force event). Similarly, multi-soft tap and multi-hard tap gestures may be optionally detected by detecting a sequence of tap events by a user on actuation surface 122.

In some implementations, input device 120 may be a mechanical switch and include a depressible component that makes contact with a conductive element in response to a user applying a force to the depressible component. Upon release of the force applied by the user, the depressible component may thereafter return to a default position in response to an expansion of a spring or other biasing element. In some implementations, the input device 120 may be electrically operated by sensing touch or proximity (e.g., by measuring capacitance of a user's digit).

Figure 4:
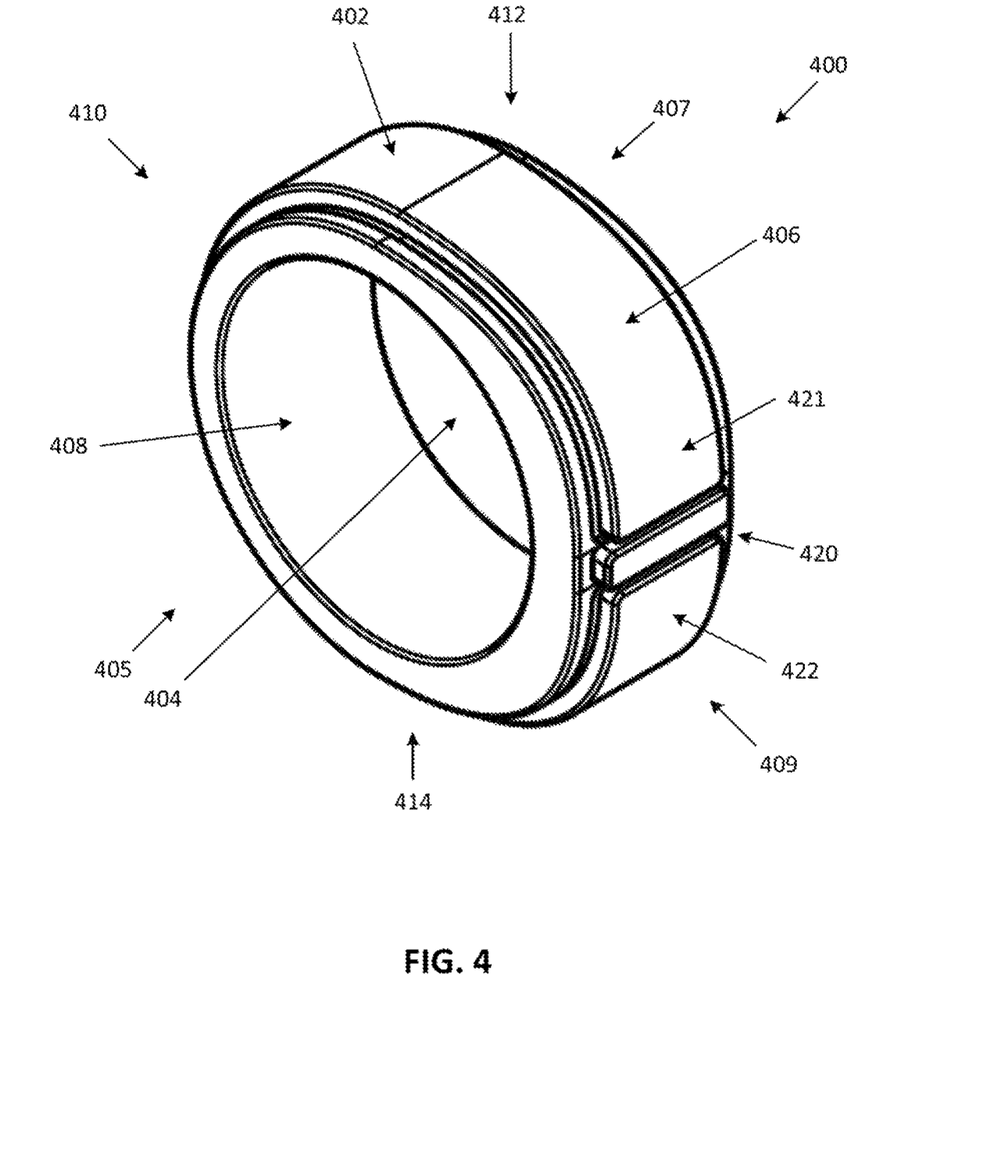
FIG. 4 is a front perspective view of a wearable electronic device having a multi-use single switch in accordance with the present systems, devices, and methods.
Figure 5:
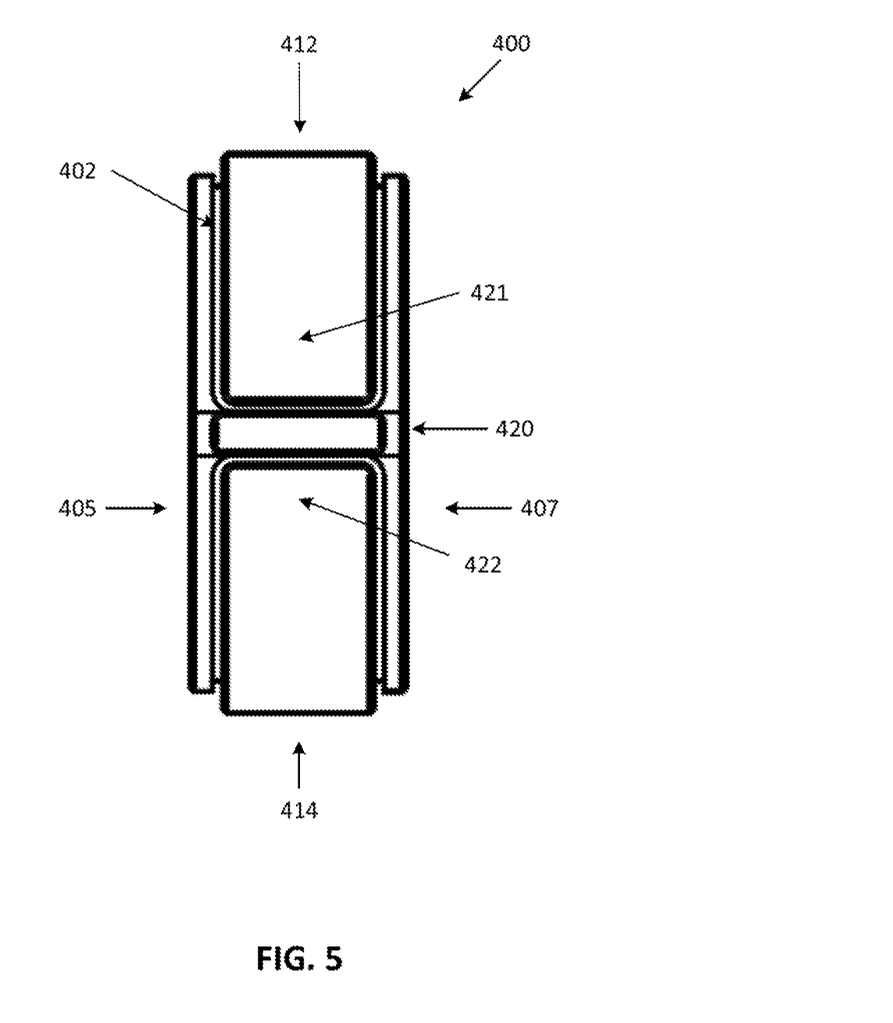
FIG. 5 is a front view of the wearable electronic device of FIG. 4.
Figure 6:
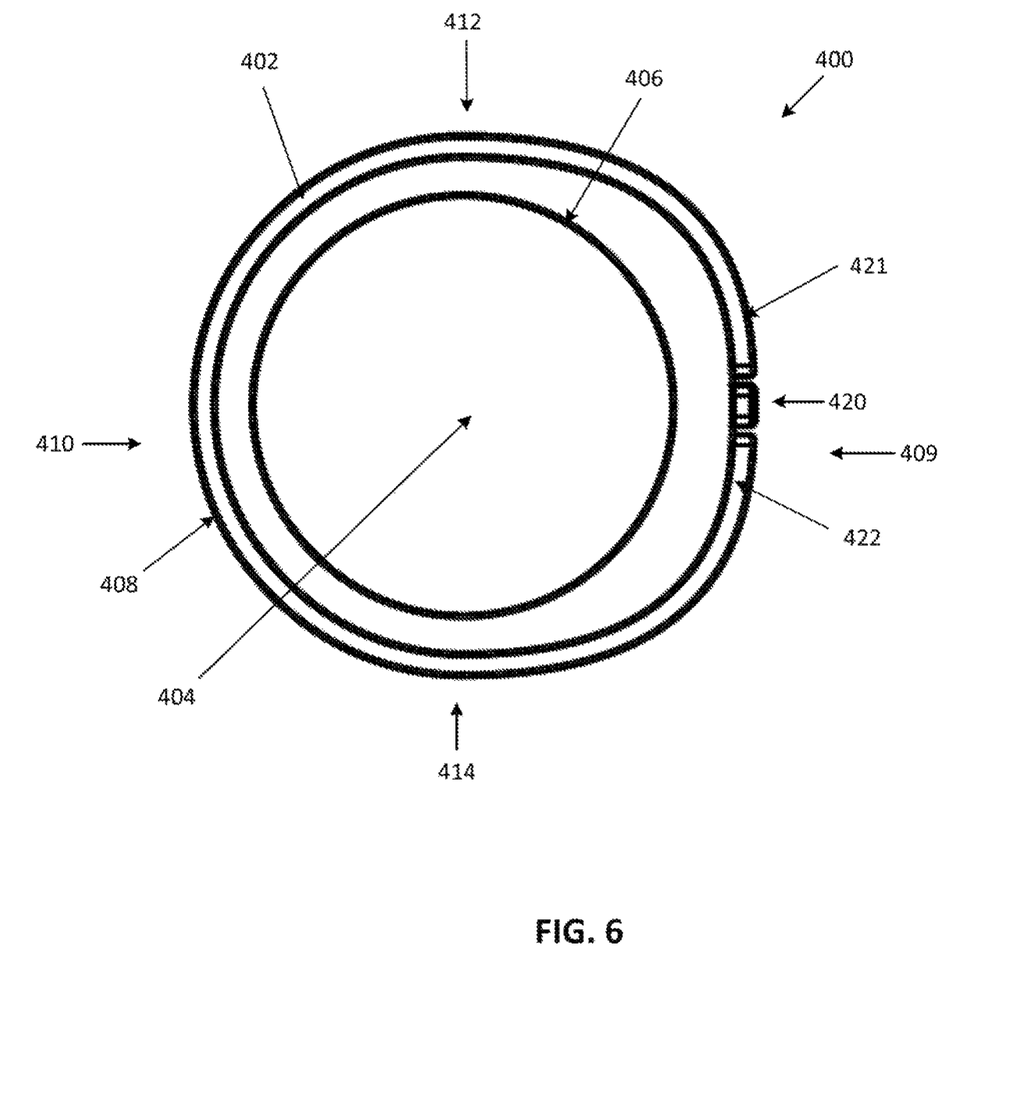
FIG. 6 is a side view of the wearable electronic device of FIG. 4.

Referring now to FIGS. 4 to 6, illustrated therein is another implementation of a wearable electronic device 400 according to the present systems, devices, and methods. Wearable electronic device 400 has a body 402 housing one or more electronic components (such as but not limited to a processor, memory, sensors, a charging member, etc., as described below). Body 402 defines an aperture 404 capable of receiving a user's digit.

Body 402 has a first side 405, a second side 407 opposed to the first side 405, a first end 409 and a second end 410 opposed to the first end 409, and a top portion 412 and a bottom portion 414 opposed to the top portion 412. Body 402 generally has an annular shape and includes an outer surface 406 and an inner surface 408. The outer surface 406 includes one or more user input devices 420, such as but not limited to one or more multi-use single switches. The inner surface 408 is sized and/or shaped to conform to the digit of the user. The inner surface 408 thereby rests against the user's digit when the device 400 is worn by the user. Wearable electronic device 400 may be available in a variety of sizes for accommodating various digit sizes and/or various types of digits.

In some implementations, the body 402 is made from a rigid or semi-rigid material such as a metal or a plastic. For instance, the body 402 may be made of gold, silver, platinum, steel, or any other appropriate metal.

Wearable electronic device 400 includes one or more input devices 420 for the electronic device 400 to receive inputs from a user. Input device 420 can assume a wide variety of forms appropriate for actuation by a user's digit (e.g., by a digit other than the digit upon which the wearable electronic device is worn, such as by a thumb when the wearable electronic device is worn on an adjacent index finger). As shown in FIGS. 4 to 6, the input device 400 has at least two multi-use single switches 421 and 422.

Input device 420 has an annular shape and is mounted on body 402. Input device 420 sits over body 402 and includes a double dome switch (e.g., tactile metal switch) for a user to provide inputs to the wearable electronic device 400.

In some implementations, input device 420 is configured as a ring that surrounds body 402. Input device 420 may be discontinuous at the first end 409. At first end 409, a first segment 421 positioned in a direction towards top portion 412 of input device 420 is depressible in a direction towards aperture 404 of the wearable electronic device 400 and a separate second segment 422 positioned in a direction towards bottom portion 414 of wearable electronic device 400 is depressible in a direction towards aperture 404 of the wearable electronic device 400. Each of the first segment 421 and the second segment 422 may provide a tactile switch for providing inputs to wearable electronic device 400. For example, each of first segment 421 and second segment 422 may receive a soft tap gesture (e.g., slightly depressing an actuation surface of first segment 421 and/or second segment 422 using a weak force event) from a user and a hard tap gesture (e.g., greatly depressing an actuation surface of first segment 421 and/or second segment 422 using a strong force event). Similarly, multi-soft tap and multi-hard tap gestures may be optionally detected by detecting a sequence of tap events by a user on each of first segment 421 and second segment 422.

Figure 7:
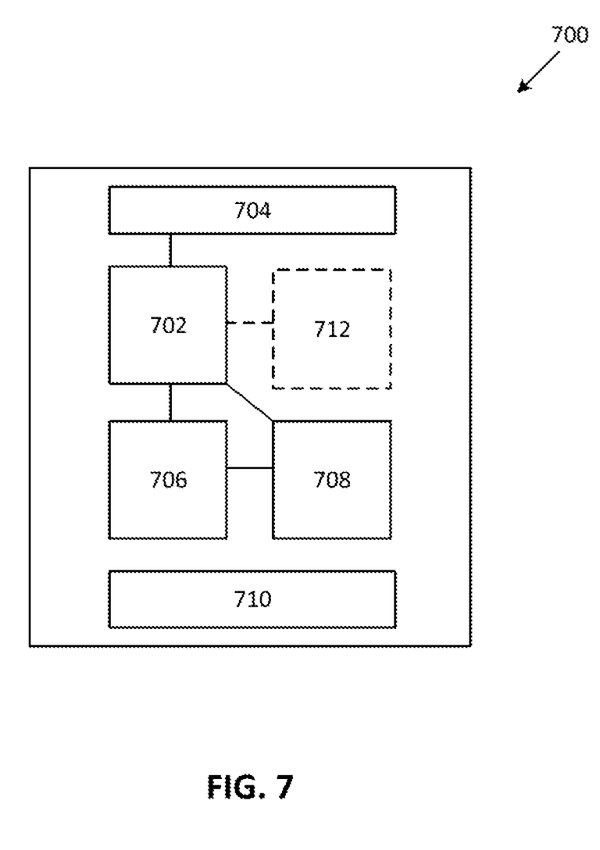
FIG. 7 is a block diagram illustrating a wearable electronic device in accordance with the present systems, devices, and methods.

FIG. 7 is a block diagram illustrating a wearable electronic device 700 with an input device in accordance with some implementations of the present systems, devices, and methods. Device 700 includes memory 702 that optionally includes one or more computer readable storage mediums, one or more processing units (CPUs) 704, RF circuitry 706, an input/output (I/O) subsystem 708 and a power system 710. Wearable electronic device 700 optionally includes one or more sensors 712.

Memory 702 optionally includes high-speed random access memory and optionally also includes non-volatile memory, such as one or more magnetic disk storage devices, flash memory devices, or other non-volatile solid-state memory devices. Access to memory 702 by other components of wearable electronic device 700, such as CPU(s) 704 is, optionally, controlled by a memory controller (not shown).

The one or more processors 704 run or execute various software programs and/or sets of instructions stored in memory 702 to perform various functions for wearable electronic device 700 and to process data.

RF (radio frequency) circuitry 706 receives and sends RF signals, also called electromagnetic signals. RF circuitry 706 converts electrical signals to/from electromagnetic signals and communicates with communications networks and other communications devices via the electromagnetic signals. RF circuitry 706 optionally includes well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 706 optionally communicates with networks, such as the Internet, an intranet and/or a wireless network, such as a cellular telephone network, a wireless local area network (LAN) and/or a metropolitan area network (MAN), and other devices by wireless communication.

I/O subsystem 708 couples input/output peripherals of wearable electronic device 700, such as input device 720 and other input or control devices, with a peripherals interface (not shown). I/O subsystem 708 includes a controller for the input device 720.

Power system 710 is generally for powering the various components of the wearable electronic device 700. Power system 710 optionally includes a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices. The recharging system may be configured to receive wired power (from, e.g., a micro-USB charger) or wireless power transmitted via electromagnetic waves and to provide the wired power to the one or more power sources.

Wearable electronic device 700 optionally also includes one or more accelerometers, gyroscopes, and/or magnetometers (e.g., as part of an inertial measurement unit (IMU)) for obtaining information concerning the position (e.g., attitude) of the device. In some embodiments, these sensors can be coupled with a peripherals interface (not shown)

It should be appreciated that wearable electronic device 700 is only one example of a wearable electronic device, and that wearable electronic device 700 optionally has more or fewer components than shown, optionally combines two or more components, or optionally has a different configuration or arrangement of the components. The various components shown in FIG. 7 are implemented in hardware, software, firmware, or a combination thereof, including one or more signal processing and/or application specific integrated circuits.

Figure 8:
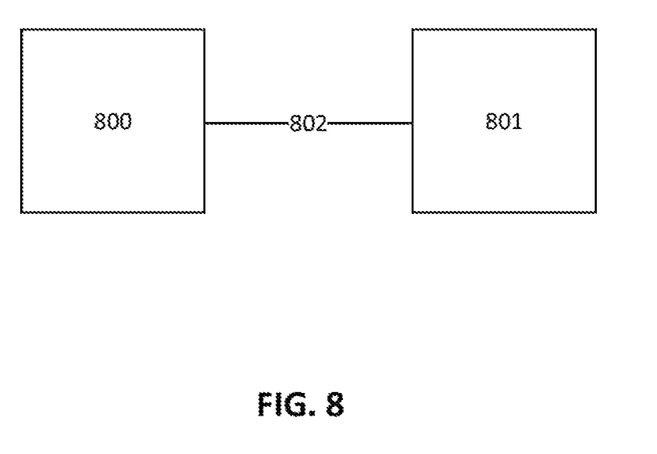
FIG. 8 is a block diagram illustrating a wearable electronic device communicating with an external electronic device in accordance with the present systems, devices, and methods.

FIG. 8 is a block diagram illustrating a system of an external electronic device 801 communicating with a wearable electronic device 800 in accordance with an implementation of the present systems, devices, and methods.

External electronic device 801 may be any external electronic device capable of being controlled by the wearable electronic device 800 according to the implementations described herein. For example, the external electronic device may be a portable computing device such as a tablet, a desktop computer, a smartphone, smart glasses, a smart watch, a storage device, a portable media player, a navigation system, or another wearable electronic device.

Electronic device 801 may include a display screen displaying a user interface for viewing by the user of the wearable electronic device 800. Wearable electronic device 800 communicates with the external electronic device 801 via a network 802, which may be a Wi-Fi network, a Bluetooth™ connection, a NFC connection, or any other type of wireless connection capable of providing uni-directional or bi-directional communication between the external electronic device 801 and the wearable electronic device 800.

Figure 9:
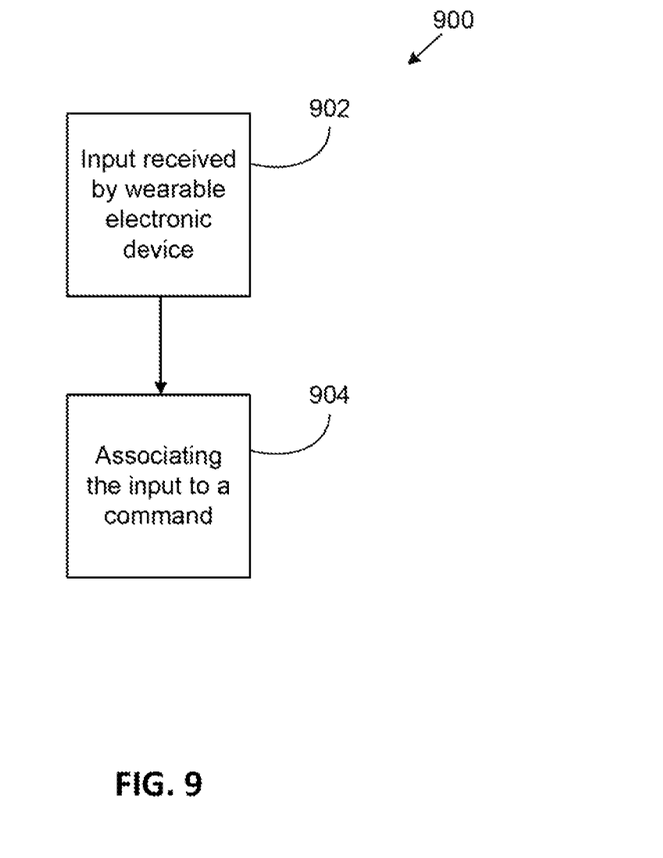
FIG. 9 is a flowchart of a method for controlling an external electronic device in accordance with the present systems, devices, and methods.

Referring now to FIG. 9, illustrated therein is a flowchart of a method 900 for controlling an external electronic device in accordance with the present systems, devices, and methods.

At 902, input is received by the wearable electronic device from a digit of a user via an input device of the wearable electronic device. The input is received as a manipulation of the input device of the wearable electronic device. Receiving the input by the wearable electronic device at 902 may include receiving, by the wearable electronic device, an input comprising any or all of: a direction of actuation, a force or pressure of actuation, a duration of actuation, and/or a nature/type of actuation. The nature/type of depression may depend on the nature/type of input device though certain input devices may be operable to receive/detect multiple natures/types of inputs. For example, for a joystick, the input may be a tap, or a double-tap, or an elongated depression (i.e., a tap and hold), or a combination of engagements or manipulations (such as a tap followed by a directional input if the input device 120 is a joystick, or a simultaneous combination of a direction and a depression).

In some implementations, receiving the input by the wearable electronic device at 902 may include receiving, by the wearable electronic device, various contact patterns (e.g., different timings and/or intensities of detected contacts) to provide different inputs. For example, at 902 the wearable input device may receive an input comprising a soft tap gesture (e.g., slightly depressing actuation surface 122 using a weak force event), a hard tap gesture (e.g., greatly depressing actuation surface 122 using a strong force event), and/or a sequence of multi-soft tap and/or multi-hard tap gestures.

At 904, the input (i.e., manipulation of the input device) received by the wearable electronic device is associated with a command. In some implementations, the input is associated with a command by a processor on-board the wearable electronic computing device prior to the command being transmitted (e.g., as a signal) by a transmitter of the wearable electronic device to the external electronic device. Alternatively or in addition, the input can be sent, by the transmitter of the wearable electronic device, directly to the external electronic device for association with the corresponding command by a processor on-board the external electronic device. The command may be, for example, a mouse, cursor, or pointer movement, a lighting control, or other such command relating to a user interface of the external electronic device.

In implementations where the input device is a "multi-use" input device in which the input device can be actuated in a variety of different ways as described previously, each distinct actuation of the input device may be mapped to a respective function of the wearable electronic device and/or of the external electronic device to which the wearable electronic device is communicatively coupled. For example, at 902 of method 900 the input device of the wearable electronic device may receive (or detect) a first input from a user of the wearable electronic device, the first input characterized by a first combination of input parameters such as a first actuation direction, a first actuation pressure, a first actuation duration, and/or a first actuation nature/type. At 904 of method 900, the first input may be mapped to or associated with a first command, either by a processor on-board the wearable electronic device and communicatively coupled to the input device, or by a processor on-board an external electronic device and communicatively coupled to a transmitter on-board the wearable electronic device (where the transmitter on-board the wearable electronic device is communicatively coupled to the input device). When the first input is mapped to or associated with a first command by a processor on-board the wearable electronic device, the wearable electronic device may include a non-transitory processor-readable storage medium communicatively coupled to the processor that stores data and/or processor-executable instructions that, when executed by the processor on-board the wearable electronic device, cause the processor on-board the wearable electronic device to map or associate the first input with a first command.

Method 900 may then be repeated, or extended, to include any number of additional inputs. For example, at 902 the input device of the wearable electronic device may receive (or detect) a second input from a user of the wearable electronic device, the second input characterized by a second combination of input parameters such as a second actuation direction, a second actuation pressure, a second actuation duration, and/or a second actuation nature/type. The second combination of input parameters corresponding to the second input may be different from the first combination of input parameters of the first input, indicating that the second input is different from the first input. At 904 of method 900, the second input may be mapped to or associated with a second command, either by a processor on-board the wearable electronic device and communicatively coupled to the input device, or by a processor on-board an external electronic device and communicatively coupled to a transmitter on-board the wearable electronic device (where the transmitter on-board the wearable electronic device is communicatively coupled to the input device). When the second input is mapped to or associated with a second command by a processor on-board the wearable electronic device, the wearable electronic device may include a non-transitory processor-readable storage medium communicatively coupled to the processor that stores data and/or processor-executable instructions that, when executed by the processor on-board the wearable electronic device, cause the processor on-board the wearable electronic device to map or associate the second input with a second command.

The second command may be different from the first command. In this way, a single input device (e.g., joystick or switch) may be actuated in a multitude of different ways to detect different inputs and effectuate different commands.

Throughout this specification and the appended claims the term "communicative" as in "communicative pathway," "communicative coupling," and in variants such as "communicatively coupled," is generally used to refer to any engineered arrangement for transferring and/or exchanging information. Exemplary communicative pathways include, but are not limited to, electrically conductive pathways (e.g., electrically conductive wires, electrically conductive traces), magnetic pathways (e.g., magnetic media), and/or optical pathways (e.g., optical fiber), and exemplary communicative couplings include, but are not limited to, electrical couplings, magnetic couplings, and/or optical couplings.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc. and/or North Inc., are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wearable electronic device comprising:
a body defining an aperture therethrough, the aperture sized and shaped to receive a first digit of a user;
a processor housed in the body;
an input device at least partially extending from an outer surface of the body and communicatively coupled to the processor, the input device operable to receive a multitude of different inputs from a second digit of the user, each input characterized by a respective combination of at least five input parameters including: an input nature, an input direction, an input duration, an input contact pattern, and an input actuation pressure; and
a transmitter communicatively coupled to the processor, the transmitter to send wireless transmissions to an external electronic device, each wireless transmission corresponding to a respective input received by the input device.

2. The wearable electronic device of claim 1 wherein the input device is a joystick and inputs received from the second digit of the user include: side-to-side movement of the joystick, up and down movement of the joystick, and depression of the joystick in a direction towards the aperture of the body.

3. The wearable electronic device of claim 2 wherein the joystick partially extends from a first end of the wearable electronic device proximate to a top portion of the wearable electronic device.

4. The wearable electronic device of claim 1 wherein the input device includes a ring that surrounds the body, the ring providing at least two segments, each segment movable by the second digit of the user between a first position and a second position to provide input to the processor.

5. The wearable electronic device of claim 4 wherein the ring is discontinuous at a first end of the body to provide the at least two segments.

6. The wearable electronic device of claim 5 wherein each of the at least two segments is a tactile switch.

7. The wearable electronic device of claim 1 wherein the body has an inner surface and an outer surface and at least a portion of the inner surface is a vertical segment to inhibit a rotation of the wearable electronic device about the first digit.

8. The wearable electronic device of claim 7 wherein the vertical segment is adjacent to the input device.

9. The wearable electronic device of claim 1 wherein the body has an annular shape.

10. The wearable electronic device of claim 1, further comprising a power source communicatively coupled to at least the processor and the transmitter.

11. The wearable electronic device of claim 1, further comprising a non-transitory processor-readable storage medium communicatively coupled to the processor, wherein the non-transitory processor-readable storage medium stores data and/or processor-executable instructions that, when executed by the processor, cause the processor to map each respective input received by the input device to a respective command based at least in part on the combination of input parameters that characterize the input, and cause the transmitter to transmit the command.

* * * * *